(12) United States Patent
Yoshizawa

(10) Patent No.: US 9,499,394 B2
(45) Date of Patent: Nov. 22, 2016

(54) MEMS DEVICE AND METHOD OF MANUFACTURING THE SAME

(71) Applicant: SEIKO EPSON CORPORATION, Tokyo (JP)

(72) Inventor: Takahiko Yoshizawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/640,886

(22) Filed: Mar. 6, 2015

(65) Prior Publication Data

US 2015/0259193 A1    Sep. 17, 2015

(30) Foreign Application Priority Data

Mar. 12, 2014 (JP) ................. 2014-048448

(51) Int. Cl.
*B81B 7/00* (2006.01)
(52) U.S. Cl.
CPC .......... *B81B 7/007* (2013.01); *B81B 2207/015* (2013.01)
(58) Field of Classification Search
CPC .............................................. B81B 2207/015
See application file for complete search history.

(56) References Cited

U.S. PATENT DOCUMENTS 5,798,283 A    8/1998    Montague et al.

FOREIGN PATENT DOCUMENTS

JP    2009-272477 A    11/2009

*Primary Examiner* — Fernando L Toledo
*Assistant Examiner* — Valerie N Newton
(74) *Attorney, Agent, or Firm* — Oliff PLC

(57) ABSTRACT

A present MEMS device includes: a functional element with a connection electrode; a structural member that forms a cavity surrounding the functional element; a second insulating film provided so as to surround a predetermined region on a first surface of the connection electrode; a first lid portion that has a third insulating film, is provided with an opening, and covers a part of the cavity; a second lid portion that has a first conductive member and a sealing portion, the first conductive member being electrically connected to the predetermined region of the connection electrode, and the sealing portion sealing the opening of the first lid portion; a fourth insulating film that insulates the first conductive member from the sealing portion; and a second conductive member that penetrates the fourth insulating film and is electrically connected to the first conductive member.

7 Claims, 4 Drawing Sheets

MEMS DEVICE AND METHOD OF MANUFACTURING THE SAME

BACKGROUND

1. Technical Field

The present invention relates to, for example, a MEMS (Micro Electro Mechanical Systems) device in which a functional element, such as a resonator, a sensor and an actuator, and/or an electronic circuit are integrated on one substrate, and a method of manufacturing such a MEMS device.

2. Related Art

For example, in a MEMS device that includes a resonator with capacitance as a functional element, the resonator is airtightly sealed, in a vacuum state, in a cavity formed in a substrate. Therefore, a cavity is formed by providing the substrate with a structural member that surrounds the resonator, and a lid portion (cap layer) is joined to the cavity with the inside of the cavity placed in a vacuum state.

Traditionally, an insulating substance of silicon nitride (P—SiN) and the like deposited using a plasma CVD (Chemical Vapor Deposition) technique is used as the lid portion for the cavity. However, in a case where the insulating substance of silicon nitride and the like is used as the lid portion for the cavity, high-vacuum cavity sealing required in a high-performance MEMS device cannot be realized.

Also, aluminum (Al), which is a material of wiring connected to impurity diffusion regions of a MOS field-effect transistor and the like, doubles as a material of a conductive member electrically connected to an external connection electrode of a functional element. However, in the case of a high-performance MOS field-effect transistor, a contact plug of tungsten (W) is used as a connecting member instead of the wiring of aluminum (Al). Therefore, a material of the connecting member for the functional element cannot double as a material of the connecting member for the high-performance MOS field-effect transistor.

As related art, the specification of U.S. Pat. No. 5,798,283 (columns 7 and 8, FIGS. 8 and 9) discloses MEM devices with an electronic circuitry on a common substrate. A cavity is formed in a substrate of these MEM devices, and silicon nitride (SiN) or silicon dioxide ($SiO_2$) is used as a material of a lid portion (cap layer) for the cavity.

On the other hand, JP-A-2009-272477 (paragraphs 0020 to 0027, FIG. 1) discloses a MEMS sensor in which a cavity is formed by a structural member provided on a semiconductor substrate. In this MEMS sensor, a wall portion of the cavity is provided on a silicon substrate via an insulating layer of silicon oxide and the like, and a peripheral portion of a lid portion (cap) for the cavity is supported on the wall portion of the cavity via the insulating layer of silicon oxide and the like. Here, the cap, a ground conductive portion, and a voltage application conductive portion are made of doped polysilicon and are formed on the same layer.

The specification of U.S. Pat. No. 5,798,283 (columns 7 and 8, FIGS. 8 and 9) and JP-A-2009-272477 (paragraphs 0020 to 0027, FIG. 1) are examples of related art.

According to the specification of U.S. Pat. No. 5,798,283 (columns 7 and 8, FIGS. 8 and 9), as silicon nitride (SiN) or silicon dioxide ($SiO_2$) is used as a material of the lid portion for the cavity, it is difficult to realize high-vacuum cavity sealing. On the other hand, in JP-A-2009-272477 (paragraphs 0020 to 0027, FIG. 1) that uses polysilicon with electrical conductivity as a material of the lid portion for the cavity, it is necessary to positionally align and join a side wall of the cavity and the lid portion with/to each other in a vacuum chamber. In addition, a structure for insulating and isolating a wiring portion for a functional element and the lid portion for the cavity from each other is important.

SUMMARY

A first advantage of some aspects of the invention is that, in a MEMS device with a cavity in which a functional element is provided, high-vacuum cavity sealing required in a high-performance MEMS device is realized using a relatively simple structure and manufacturing method. A second advantage of some aspects of the invention is that a wiring portion for the functional element and a lid portion for the cavity are reliably insulated and isolated from each other. A third advantage of some aspects of the invention is that a material of a connecting member for the functional element doubles as a material of a connecting member for a high-performance semiconductor circuit element.

A MEMS device according to an aspect of the invention includes: a substrate; a functional element that is provided, either directly or via a first insulating film, on a surface of the substrate, and has a connection electrode; a structural member that is provided on the surface of the substrate or on a surface of the first insulating film, and forms a cavity surrounding the functional element; a second insulating film that is provided so as to surround a predetermined region on a first surface of the connection electrode; a first lid portion that has a third insulating film covering the second insulating film at the first surface of the connection electrode, is provided with an opening, and covers a part of the cavity; a second lid portion that is provided on a surface of the first lid portion and has a first conductive member and a sealing portion, the first conductive member being electrically connected to the predetermined region of the connection electrode, and the sealing portion sealing the opening of the first lid portion; a fourth insulating film that is provided on a surface of the second lid portion, is in contact with the second insulating film or the third insulating film, and insulates the first conductive member from the sealing portion; and a second conductive member that penetrates the fourth insulating film and is electrically connected to the first conductive member.

A method of manufacturing a MEMS device according to an aspect of the invention includes: (a) forming a functional element and a structural member, either directly or via a first insulating film, on a surface of a substrate, the functional element having a connection electrode, and the structural member forming a cavity surrounding the functional element; (b) forming a second insulating film such that the second insulating film surrounds a predetermined region on a first surface of the connection electrode and is present in the cavity; (c) forming a first lid portion which has a third insulating film covering the second insulating film at the first surface of the connection electrode, in which an opening is formed, and which covers a part of the cavity; (d) removing the second insulating film in the cavity through release etching; (e) forming a second lid portion on a surface of the first lid portion in a vacuum chamber, the second lid portion having a first conductive member and a sealing portion, the first conductive member being electrically connected to the predetermined region of the connection electrode, and the sealing portion sealing the opening of the first lid portion; (f) forming, on a surface of the second lid portion, a fourth insulating film that is in contact with the second insulating film or the third insulating film and insulates the first conductive member from the sealing portion; and (g) forming a second conductive member that penetrates the fourth insulating film and is electrically connected to the first conductive member.

According to an aspect of the invention, the second lid portion, which includes the first conductive member electrically connected to the connection electrode of the functional element and the sealing portion sealing the opening of the first lid portion, is provided on the surface of the first lid portion. Therefore, high-vacuum cavity sealing required in a high-performance MEMS device can be realized using a relatively simple structure and manufacturing method. Also, as a material of the first conductive member electrically connected to the connection electrode of the functional element doubles as a material of the sealing portion, manufacturing processes of the MEMS device can be reduced.

Here, the fourth insulating film may penetrate the second lid portion and the third insulating film and be in contact with the second insulating film. In this way, the first conductive member and the sealing portion can be reliably insulated and isolated from each other by the second to fourth insulating films.

Also, the substrate may be a semiconductor substrate provided with a semiconductor circuit element, a contact plug that penetrates at least the fourth insulating film and is electrically connected to the semiconductor circuit element may be provided, and the second conductive member that is electrically connected to the first conductive member may be formed of the same material as the contact plug. In this way, a material of a connecting member for the functional element can double as a material of a connecting member for the semiconductor circuit element.

In this case, the cavity may be formed in a trench of the semiconductor substrate. In this way, a layer structure formed on the semiconductor substrate is planarized, and formation of a wiring layer is made easy. In addition, the height of an upper end of a contact plug for the functional element can be aligned with the height of an upper end of a contact plug for the semiconductor circuit element, and these contact plugs can be brought into connection to each other by wiring provided on the same layer.

The above-referenced second and fourth insulating films, third insulating film, and second lid portion may be formed of silicon dioxide ($SiO_2$), silicon nitride (SiN), and aluminum (Al), respectively. In this case, in a release etching process, the second insulating film of silicon dioxide can be protected by the third insulating film of silicon nitride that has a high resistance to an etchant, and a degree of vacuum can be prevented from decreasing due to discharge of gas, such as water vapor, from silicon dioxide. Also, aluminum is suitable as a material of the sealing portion that realizes high-vacuum cavity sealing required in a high-performance MEMS device.

Furthermore, the contact plug may be formed of tungsten (W). In the case of a high-performance MOS field-effect transistor, a contact plug of tungsten (W) is used as a connecting member. Therefore, by forming the second conductive member that is electrically connected to the first conductive member with tungsten (W), a material of a connecting member for the functional element can double as a material of a connecting member for the high-performance MOS field-effect transistor.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes an embodiment of the invention in detail with reference to the accompanying drawings. It should be noted that the same constituent element is assigned the same reference sign, and redundant descriptions are omitted.

A MEMS device according to the embodiment of the invention is a device in which a functional element, such as a resonator, a sensor and an actuator, and/or an electronic circuit are integrated on one substrate.

Below, as one example, a MEMS device will be described that includes a resonator with capacitance as a functional element, and also includes a MOS field-effect transistor as a semiconductor circuit element. The resonator is, for example, airtightly sealed in a cavity formed in a trench (a recessed portion in a surface) of a semiconductor substrate.

Figure 1:
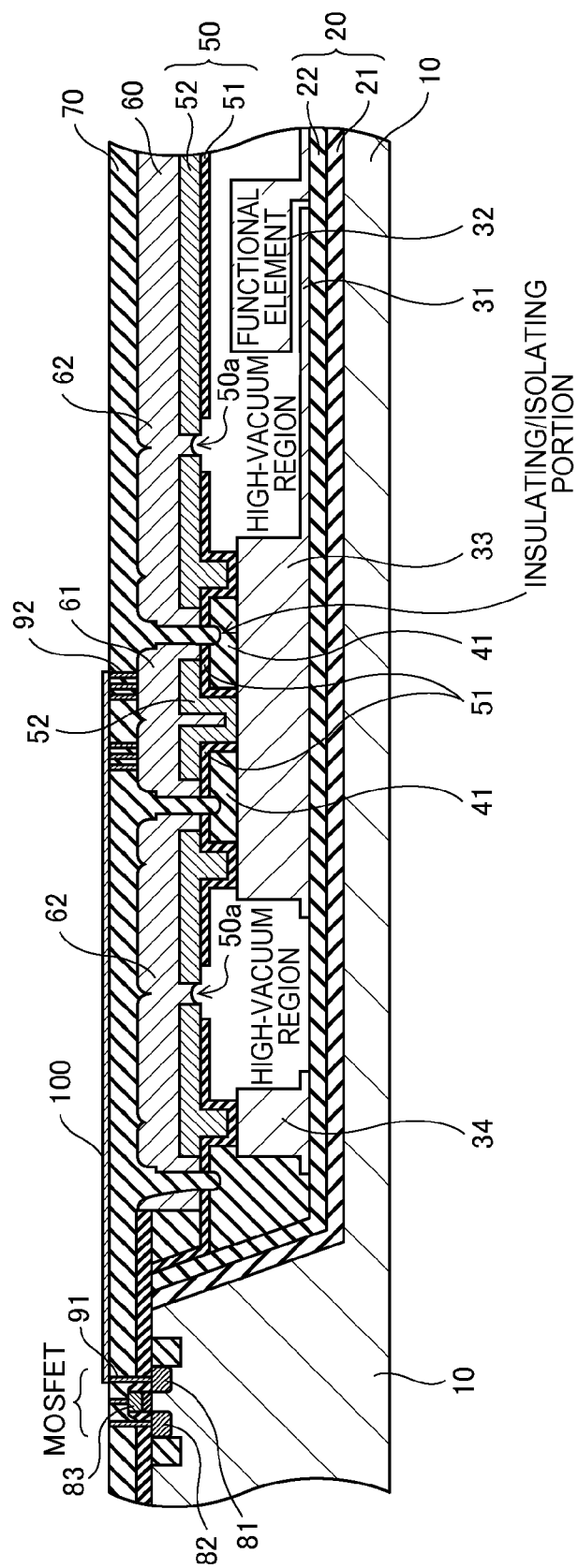
FIG. 1 is a cross-sectional view showing major portions of a MEMS device according to an embodiment of the invention.

FIG. 1 is a cross-sectional view showing major portions of the MEMS device according to the embodiment of the invention. As shown in FIG. 1, this MEMS device uses a semiconductor substrate 10 whose main surface (an upper surface in the figure) has a first region (the right side in the figure) in which a trench is formed and a second region (the left side in the figure) in which impurity diffusion regions of a semiconductor circuit element are formed.

The resonator includes a lower electrode 31, an upper electrode 32 and an external connection electrode 33 that are provided on a bottom surface of the trench of the semiconductor substrate 10 via an insulating film 20. A wall portion 34 is provided as a structural member that forms a cavity surrounding these electrodes. For example, the insulating film 20 includes an insulating film 21 of silicon dioxide ($SiO_2$) and an insulating film 22 of silicon nitride (SiN). It should be noted that the wall portion 34 may be provided directly on the bottom surface of the trench of the semiconductor substrate 10. Also, in a case where a substrate with high insulating properties, such as a substrate of glass, ceramics, resin, or the like, is used, the lower electrode 31 to the external connection electrode 33 may be provided directly on the substrate.

The lower electrode 31 to the wall portion 34 are formed of, for example, polysilicon that has been doped with impurities and has electrical conductivity. The upper electrode 32 of the resonator includes a cantilever-like structural member that is fixed at one end and movable at the other end. The external connection electrode 33 is electrically connected to the lower electrode 31, and may be constructed integrally with the lower electrode 31. It should be noted that, in FIG. 1, an external connection electrode that is electrically connected to the upper electrode 32 is not shown.

In the trench of the semiconductor substrate 10, a region surrounded by the wall portion 34 is the cavity. The space in the cavity is a high-vacuum region. By applying an alternating current voltage between the lower electrode 31 and the upper electrode 32 in the resonator provided in the cavity, mechanical oscillation of the upper electrode 32 is excited by an electrostatic force, and a change in capacitance between the lower electrode 31 and the upper electrode 32 attributed to this mechanical oscillation is detected.

The external connection electrode 33 has, for example, a shape of a flat prism or cylinder, and an insulating film 41 is provided so as to surround a predetermined region on a first surface (an upper surface in the figure) of the external connection electrode 33. At the first surface of the external connection electrode 33, an insulating film 51 that covers the insulating film 41 is also provided.

Here, it is easy to increase a film thickness of the insulating film 41, and the insulating film 51 has a higher resistance to an etchant than the insulating film 41 in a later-described release etching process. For example, the insulating film 41 may be formed of silicon dioxide ($SiO_2$) and the like, and the insulating film 51 may be formed of silicon nitride (SiN) and the like.

Together with a polysilicon film 52 that has electrical conductivity, the insulating film 51 constitutes a first lid portion 50. It should be noted that a surface of the polysilicon film 52 may be provided with a titanium nitride (TiN) film, a salicide film, or the like. Also, a part of the polysilicon film 52 is provided in the predetermined region of the first surface of the external connection electrode 33, and is electrically connected to the external connection electrode 33. An opening (release hole) 50a is formed in the first lid portion 50. The part of the first lid portion 50 other than the opening 50a covers the cavity.

With the inside of the cavity placed in a decompressed state (vacuum state), a second lid portion 60 is formed on a surface of the first lid portion 50 by metal, such as aluminum (Al). It should be noted that this surface of the first lid portion 50 and a cavity-side face of the first lid portion 50 represent front and back faces. The second lid portion 60 includes an intermediate conductive member 61 that is electrically connected to the predetermined region of the first surface of the external connection electrode 33 via the polysilicon film 52, and a sealing portion 62 that seals the opening 50a of the first lid portion.

In this way, the second lid portion 60, which includes the intermediate conductive member 61 electrically connected to the external connection electrode 33 of the resonator and the sealing portion 62 that seals the opening 50a of the first lid portion, is provided on the surface of the first lid portion 50. Accordingly, high-vacuum cavity sealing required in a high-performance MEMS device can be realized using a relatively simple structure and manufacturing method.

An insulating film 70 of silicon dioxide ($SiO_2$), BPSG (Boron Phosphorus Silicon Glass), or the like is provided on a surface of the second lid portion 60. The insulating film 70 is in contact with the insulating film 41 or 51, and insulates the intermediate conductive member 61 from the sealing portion 62. The insulating film 70 may constitute an insulating/isolating portion by penetrating the second lid portion 60 and the insulating film 51 and coming into contact with the insulating film 41 as shown in FIG. 1. In this way, the insulating film 41, the insulating film 51 and the insulating film 70 can reliably insulate and isolate the intermediate conductive member 61 from the sealing portion 62.

The insulating film 70 may extend to a second region of the semiconductor substrate 10 in which the semiconductor circuit element is formed. The semiconductor circuit element is provided in the second region of the semiconductor substrate 10. For example, impurity diffusion regions 81 and 82, which serve as a source and a drain of a MOS field-effect transistor (MOSFET), are provided inside the semiconductor substrate 10, and a gate electrode 83 is provided on the semiconductor substrate 10 via a gate insulating film. Also, for example, a contact plug (electrode) 91 of tungsten (W) and the like, which penetrates at least the insulating film 70 and is electrically connected to the impurity diffusion regions 81 and 82 and the gate electrode 83, is provided.

Therefore, in a first region of the semiconductor substrate 10, a conductive member that penetrates the insulating film 70 and is electrically connected to the intermediate conductive member 61 may be formed of the same material as the contact plug 91. For example, a contact plug (electrode) 92 of tungsten (W) and the like, which penetrates the insulating film 70 and is electrically connected to the intermediate conductive member 61, is provided. For example, wiring 100 of aluminum (Al) and the like, which is provided on a surface of the insulating film 70, brings the contact plug 91 and the contact plug 92 into electrical connection to each other. In this way, the external connection electrode 33 of the resonator can be electrically connected to the MOS field-effect transistor.

By thus using, as a connecting member for the functional element, a conductive member formed of the same material as a connecting member for the semiconductor circuit element, the material of the connecting member for the functional element can double as the material of the connecting member for the high-performance semiconductor circuit element. Also, as the cavity is formed in the trench of the semiconductor substrate 10, a layer structure formed on the semiconductor substrate 10 is planarized, and formation of a wiring layer is made easy. Furthermore, the height of an upper end of the contact plug 92 for the functional element can be aligned with the height of an upper end of the contact plug 91 for the semiconductor circuit element, and these contact plugs can be brought into connection to each other by wiring provided on the same layer.

A description is now given of a method of manufacturing the MEMS device shown in FIG. 1.

Figure 2A:
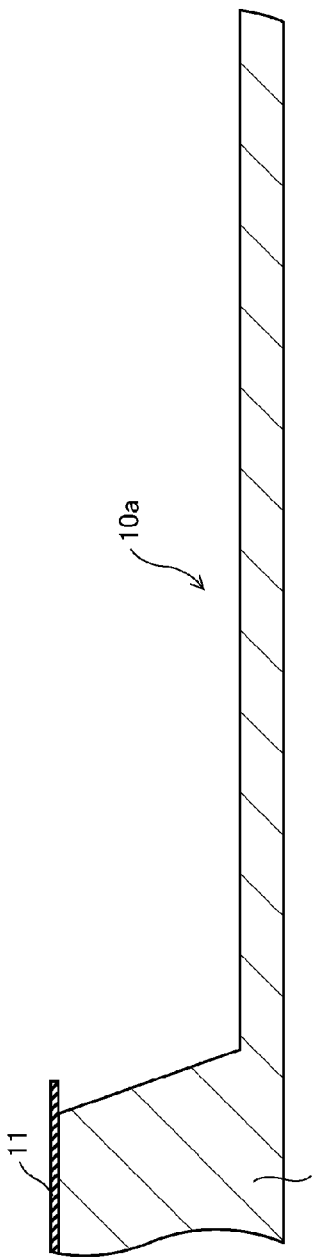
FIGS. 2A to 2C are cross-sectional views pertaining to manufacturing processes of the MEMS device according to the embodiment of the invention.

FIGS. 2A to 3C are cross-sectional views pertaining to manufacturing processes of the MEMS device according to the embodiment of the invention. First, for example, by providing a resist 11 using a photolithography technique and applying dry etching to a part of the main surface of the semiconductor substrate 10 constructed from a silicon monocrystal and the like, a deep trench 10a is formed in the first region of the main surface of the semiconductor substrate 10 as shown in FIG. 2A. Thereafter, the resist 11 is removed.

Figure 2B:
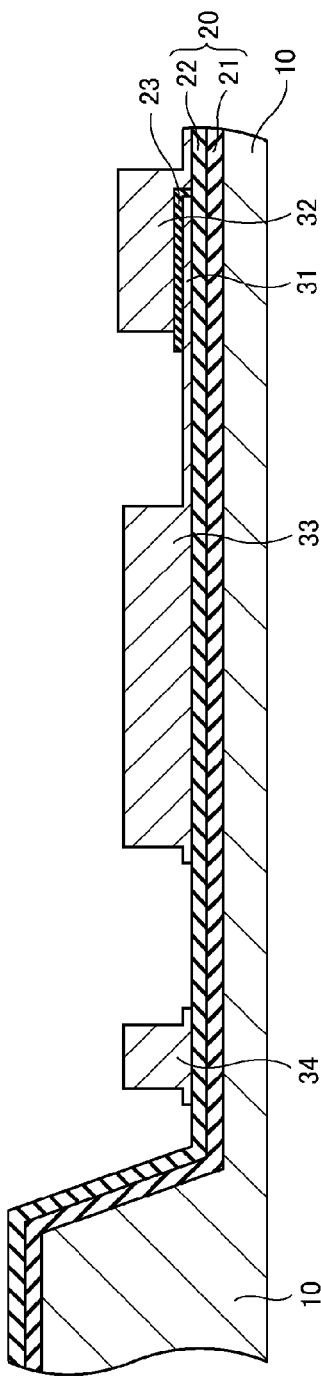

Next, as shown in FIG. 2B, the insulating film 20 is formed on a bottom surface of the trench of the semiconductor substrate 10. For example, the insulating film 20 includes the insulating film 21 of silicon dioxide ($SiO_2$) and the insulating film 22 of silicon nitride (SiN). The insulating film 22 of silicon nitride (SiN) withstands wet etching (release etching) for removing a later-described sacrificial film in the cavity.

Also, for example, polysilicon that has been doped with impurities and has electrical conductivity is formed on the bottom surface of the trench of the semiconductor substrate 10 via the insulating film 20, and patterning is applied through dry etching that uses a resist. Consequently, the lower electrode 31 of the resonator is formed. Furthermore, after forming a gap sacrificial film 23 on the lower electrode 31, for example, polysilicon that has electrical conductivity is formed, and patterning is applied through dry etching that uses a resist. Consequently, the upper electrode 32 and the external connection electrode 33 of the resonator and the wall portion 34 are formed. Thereafter, the gap sacrificial film 23 is removed through wet etching.

In this way, the resonator including the external connection electrode, as well as the wall portion 34, which is the structural member that forms the cavity surrounding the resonator, is formed on the bottom surface of the trench of the semiconductor substrate 10 via the insulating film 20. It should be noted that the wall portion 34 may be provided directly on the bottom surface of the trench of the semiconductor substrate 10. Also, in a case where a substrate with high insulating properties, such as a substrate of glass, ceramics, resin, or the like, is used, the lower electrode 31 to the external connection electrode 33 may be provided directly on the substrate.

Figure 2C:
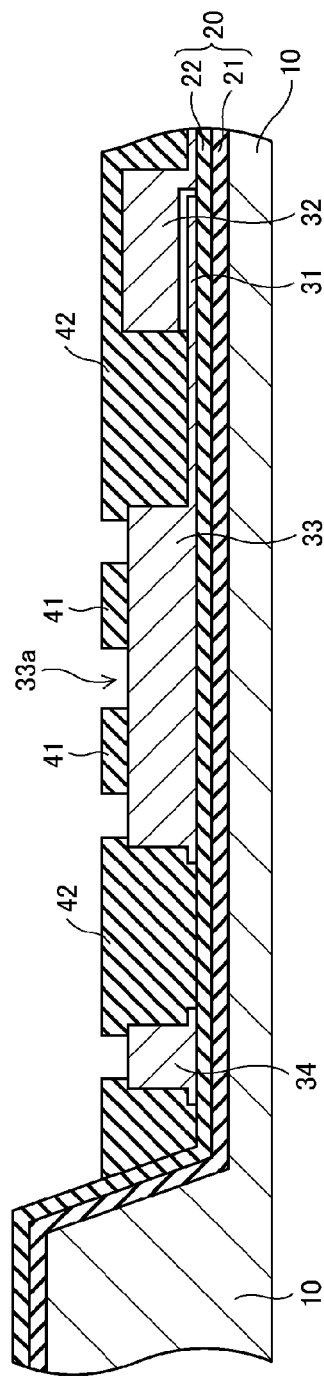

Next, after an insulating film of silicon dioxide ($SiO_2$) and the like is deposited, using a plasma CVD technique, on the surface of the semiconductor substrate 10 on which the resonator and the like are formed, the insulating film of silicon dioxide ($SiO_2$) and the like is polished by CMP (Chemical Mechanical Polishing), and patterning is applied through etching. As a result, as shown in FIG. 2C, the insulating film 41 of silicon dioxide ($SiO_2$) and the like is formed so as to surround a predetermined region 33a on a surface of the external connection electrode 33, and an insulating film 42 of silicon dioxide ($SiO_2$) and the like is formed as a sacrificial film in the cavity.

Figure 3A:
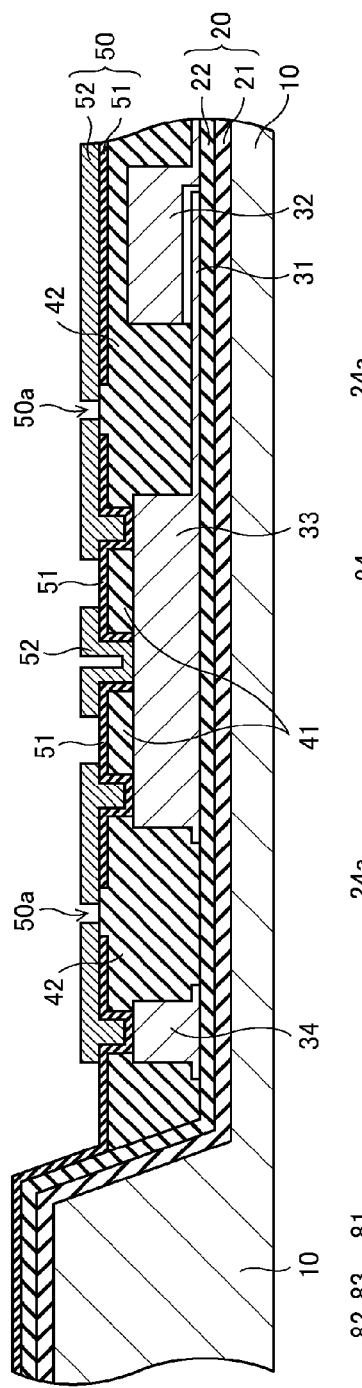
FIGS. 3A to 3C are cross-sectional views pertaining to manufacturing processes of the MEMS device according to the embodiment of the invention.

Next, after an insulating film of silicon nitride (SiN) and the like is formed on the surface of the semiconductor substrate 10 on which the insulating films 41 and 42 and the like are formed, patterning is applied to the insulating film of silicon nitride (SiN) and the like through dry etching that uses a resist. As a result, as shown in FIG. 3A, the insulating film 51 of silicon nitride (SiN) and the like is formed. The insulating film 51 covers the insulating film 41 at the first surface of the external connection electrode 33, and covers a part of the cavity.

Also, after a polysilicon film that has electrical conductivity is formed on the surface of the semiconductor substrate 10 on which the insulating film 51 and the like are formed, patterning is applied to the polysilicon film through dry etching that uses a resist. As a result, as shown in FIG. 3A, the first lid portion 50 including the insulating film 51 and the polysilicon film 52 is formed. The opening 50a is formed in the first lid portion 50. The part of the first lid portion 50 other than the opening 50a covers the cavity. Here, a part of the polysilicon film 52 is provided in the predetermined region of the first surface of the external connection electrode 33, and is electrically connected to the external connection electrode 33.

Figure 3B:
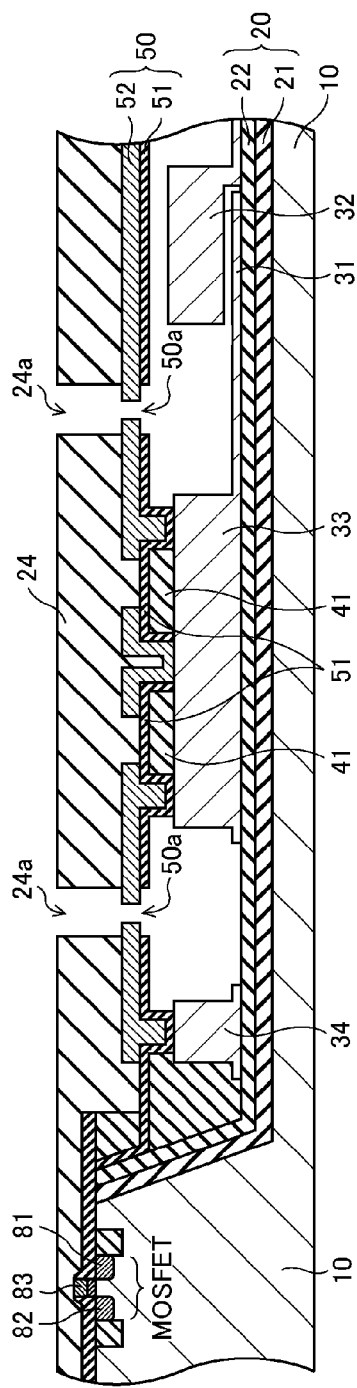

Next, on the surface of the semiconductor substrate 10 on which the first lid portion 50 and the like are formed, for example, grooves are formed, an insulating film of silicon dioxide ($SiO_2$) and the like is formed, and insulating film planarization is applied. Thereafter, for example, a MOS field-effect transistor (MOSFET) is formed as a semiconductor circuit element in the second region of the semiconductor substrate 10 as shown in FIG. 3B.

That is to say, the gate electrode 83 is formed on the semiconductor substrate 10 via the gate insulating film, and the impurity diffusion regions 81 and 82 that serve as the source and the drain are formed inside the semiconductor substrate 10 on both sides of the gate electrode 83. Also, insulating side walls may be formed on side walls of the gate insulating film and the gate electrode 83. Furthermore, an insulating film of a predetermined thickness may be formed in a region surrounding the insulating side walls.

In addition, a resist 24 that has an opening 24a in a position corresponding to the opening 50a of the first lid portion is provided, using a photolithography technique, on the surface of the semiconductor substrate 10 on which the MOS field-effect transistor and the like are formed. Furthermore, the sacrificial film in the cavity is removed through wet etching (release etching) that uses hydrofluoric acid and the like as an etchant. Thereafter, the resist 24 is removed using MCP and the like.

Figure 3C:
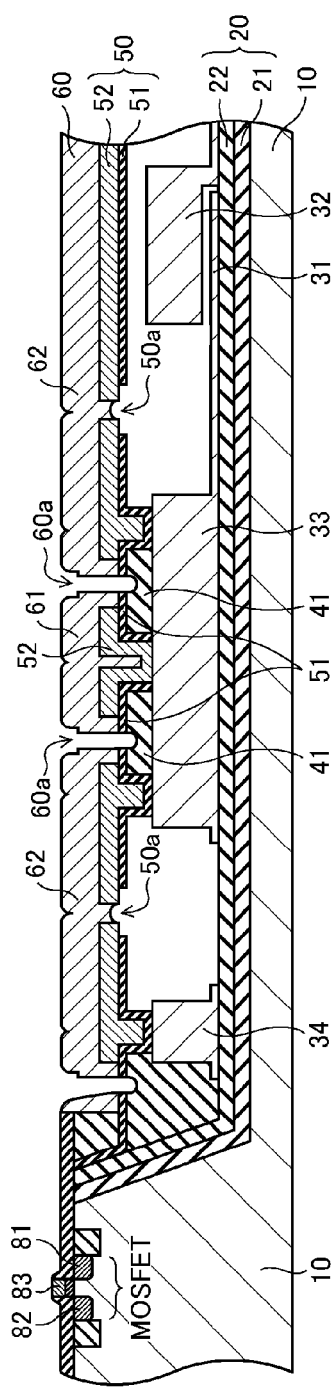

Next, metal, such as aluminum (Al), is deposited on the surface of the first lid portion 50 through sputtering (a high-vacuum film formation technique) in a vacuum chamber, and patterning is applied to the deposited metallic layer through dry etching that uses a resist. In this way, as shown in FIG. 3C, the second lid portion 60 is formed on the surface of the first lid portion 50 by metal, such as aluminum (Al).

The second lid portion 60 includes the intermediate conductive member 61 that is electrically connected to a predetermined region of the external connection electrode 33 via the polysilicon film 52, and the sealing portion 62 that seals the opening 50a of the first lid portion. Also, the opening 60a, which penetrates the second lid portion 60 and the insulating film 51 and extends to the insulating film 41, is formed through dry etching that uses a resist.

Next, as shown in FIG. 1, the insulating film 70 of silicon dioxide ($SiO_2$), BPSG, or the like is formed on the surface of the second lid portion 60. The insulating film 70 is in contact with the insulating film 41 or 51, and insulates the intermediate conductive member 61 of the second lid portion 60 from the sealing portion 62. The insulating film 70 may constitute the insulating/isolating portion by penetrating the second lid portion 60 and the insulating film 51 and coming into contact with the insulating film 41 as shown in FIG. 1.

The insulating film 70 may extend to the second region of the semiconductor substrate 10 in which the MOS field-effect transistor is formed. In this case, the contact plugs 91 and 92 of tungsten (W) and the like are simultaneously formed. The contact plug 91 penetrates the insulating film 70 and is electrically connected to the MOS field-effect transistor, whereas the contact plug 92 penetrates the insulating film 70 and is electrically connected to the intermediate conductive member 61. Thereafter, the contact plugs 91 and 92 are brought into electrical connection to each other by forming the wiring 100 of aluminum (Al) and the like on the surface of the insulating film 70.

Figure 4A:
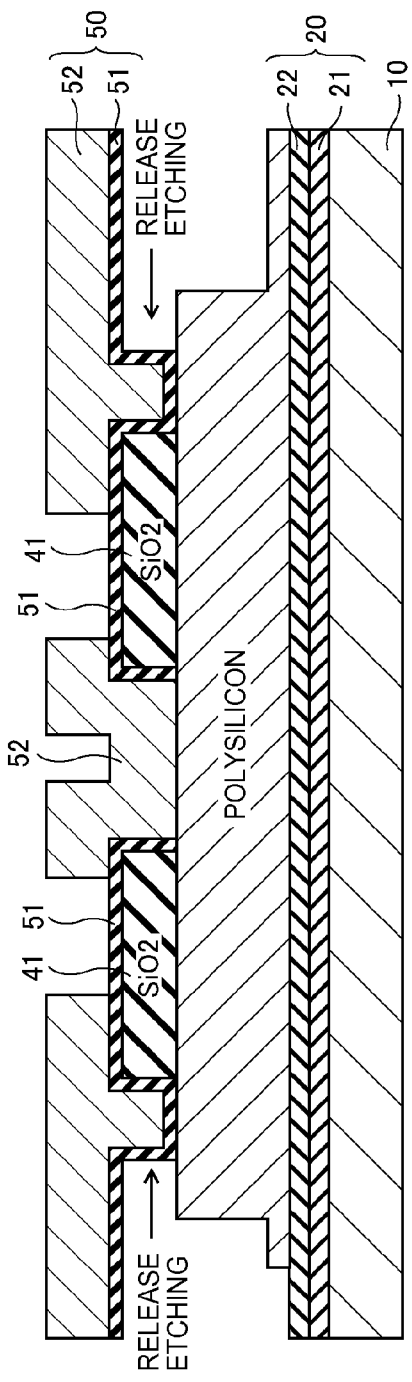
FIGS. 4A and 4B are enlarged cross-sectional views showing a part of the MEMS device in major manufacturing processes.
Figure 4B:
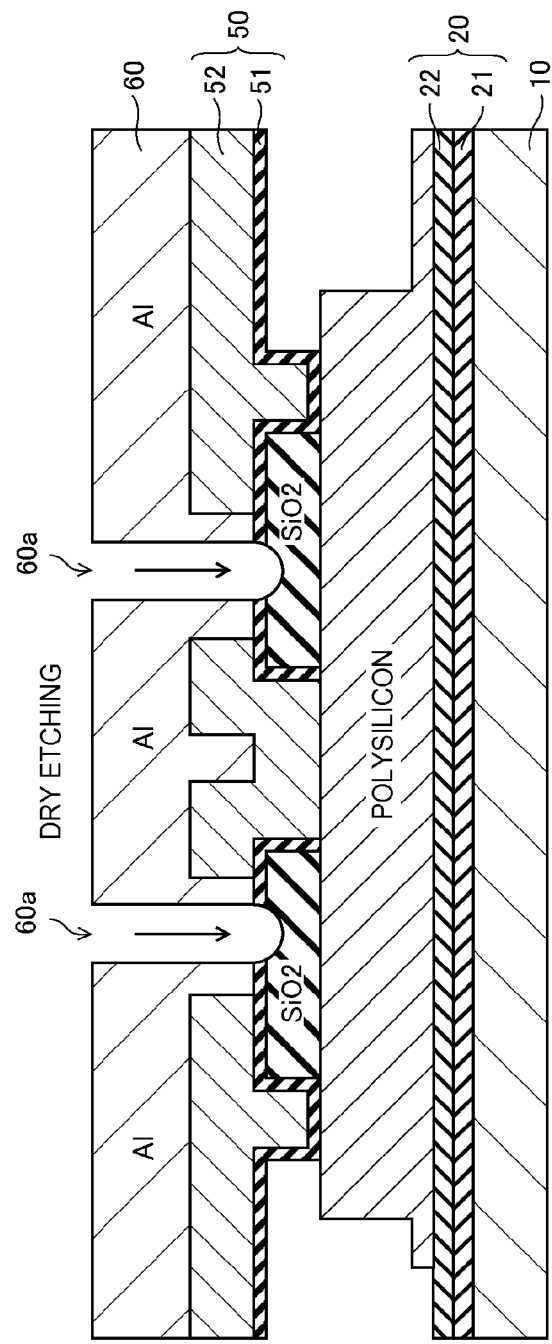

FIGS. 4A and 4B are enlarged cross-sectional views showing a part of the MEMS device in major manufacturing processes. FIG. 4A shows a part of the MEMS device in the release etching process. The following describes a case in which the insulating film 41 and the insulating film 51 are formed of silicon dioxide ($SiO_2$) and silicon nitride (SiN), respectively. In this case, hydrofluoric acid can be used as an etchant in the release etching process. While hydrofluoric acid dissolves and corrodes silicon dioxide ($SiO_2$), it is difficult to dissolve silicon nitride (SiN) with hydrofluoric acid.

Therefore, by covering the insulating film 41 of silicon dioxide ($SiO_2$) with the insulating film 51 of silicon nitride (SiN), which has a high resistance to etching, on the external connection electrode 33 as shown in FIG. 4A, the insulating film 41 can be protected from the etchant, and a degree of vacuum can be prevented from decreasing due to discharge of gas, such as water vapor, from silicon dioxide ($SiO_2$).

Also, the insulating film 41 plays a role in guarding the external connection electrode 33 and the polysilicon film 52 such that electrical connection between the external connection electrode 33 and the polysilicon film 52 is not damaged by release etching. For this reason, the insulating film 41 needs to have a reasonable size. In view of this, the size of the insulating film. 41 can be reduced by protecting the insulating film 41 from the etchant with the insulating film 51.

FIG. 4B shows a part of the MEMS device in a process for applying dry etching to aluminum and the like. As shown in FIG. 4B, the opening 60a that penetrates the second lid portion 60 and the insulating film 51 and extends to the insulating film 41 is formed through dry etching. In this dry etching process, the insulating film 51 of silicon nitride (SiN) is easy to etch, whereas the insulating film 41 of silicon dioxide (SiO$_2$) is difficult to etch. Therefore, the insulating film 41 can protect the external connection electrode 33 by preventing application of dry etching to the external connection electrode 33.

While the above-described embodiment has discussed a MEMS device with a cavity that is formed in a deep trench of a semiconductor substrate, the invention is by no means limited to the above-described embodiment. For example, the invention can be utilized in a MEMS device with a cavity that is formed in a shallow trench of a substrate or on the substrate, and can be modified in many ways by a person of ordinary skill in the art within the technical ideas of the invention.

The entire disclosure of Japanese Patent Application No. 2014-048448, filed Mar. 12, 2014 is expressly incorporated by reference herein.

What is claimed is:

1. A MEMS device, comprising:
   a substrate;
   a functional element that is provided, either directly or via a first insulating film, on a surface of the substrate, and includes a connection electrode;
   a structural member that is provided on the surface of the substrate or on a surface of the first insulating film, and forms a cavity surrounding the functional element;
   a second insulating film that is provided so as to surround a predetermined region on a first surface of the connection electrode;
   a first lid portion that includes (1) a third insulating film covering the second insulating film at the first surface of the connection electrode, and (2) a conductive material film, the first lid portion being provided with an opening, and covering a part of the cavity, wherein a width of the opening of the first lid portion is wider at the third insulating film than at the conductive material film;
   a second lid portion that is provided on a surface of the first lid portion and includes a first conductive member and a sealing portion, the first conductive member being electrically connected to the predetermined region of the connection electrode, and the sealing portion sealing the opening of the first lid portion;
   a fourth insulating film that is provided on a surface of the second lid portion, is in contact with the second insulating film or the third insulating film, and insulates the first conductive member from the sealing portion; and
   a second conductive member that penetrates the fourth insulating film and is electrically connected to the first conductive member.

2. The MEMS device according to claim 1, wherein
   the fourth insulating film penetrates the second lid portion and the third insulating film and is in contact with the second insulating film.

3. The MEMS device according to claim 1, wherein
   the substrate is a semiconductor substrate provided with a semiconductor circuit element, and a contact plug that penetrates at least the fourth insulating film and is electrically connected to the semiconductor circuit element is provided, and
   the second conductive member that is electrically connected to the first conductive member is formed of the same material as the contact plug.

4. The MEMS device according to claim 3, wherein
   the cavity is formed in a trench of the semiconductor substrate.

5. The MEMS device according to claim 1, wherein
   the second insulating film and the fourth insulating film are formed of silicon dioxide (SiO$_2$),
   the third insulating film is formed of silicon nitride (SiN), and
   the second lid portion is formed of aluminum (Al).

6. The MEMS device according to claim 3, wherein
   the contact plug is formed of tungsten (W).

7. The MEMS device according to claim 1, wherein the conductive material film is provided between the connection electrode and the first conductive member.

* * * * *